United States Patent [19]
Salama et al.

[11] Patent Number: 5,439,879
[45] Date of Patent: Aug. 8, 1995

[54] METHOD FOR JOINING SUPERCONDUCTOR SEGMENTS TO FORM A SUPERCONDUCTING ARTICLE

[75] Inventors: Kamel Salama; Venkatakrishnan Selvamanickam, both of Houston, Tex.

[73] Assignee: University of Houston-University Park, Houston, Tex.

[21] Appl. No.: 85,453

[22] Filed: Jun. 30, 1993

Related U.S. Application Data

[63] Continuation of Ser. No. 837,001, Feb. 14, 1992, abandoned.

[51] Int. Cl.$^6$ ............................................. H01L 39/12
[52] U.S. Cl. ...................................... 505/500; 156/47; 156/89; 505/450
[58] Field of Search .................. 156/47, 49, 89, 157, 156/158, 304.6; 505/1, 725, 739, 780, 925, 927, 450, 500

[56] References Cited

U.S. PATENT DOCUMENTS

| | | | |
|---|---|---|---|
| 5,081,074 | 1/1992 | Murayama et al. | 505/1 |
| 5,157,017 | 10/1992 | Jin et al. | 505/1 |

FOREIGN PATENT DOCUMENTS 3-30264 2/1991 Japan.

OTHER PUBLICATIONS

Japanese Patent Abstract JP 3030264 Jun. 27, 1989.
Murayama N. et al. "Joining of Hot-Pressed Bi-Pb-Sr-Ca-Cu-O Superconductor," *Japanese Journal of Applied Physics*, vol. 28, No. 10, Oct. 1989; pp. L1740-1741.
Murayama N. et al. "Hot-pressing of Bi-Pb-Sr-Ca-Cu-O Superconducting Thick Film," *Japanese Journal of Applied Physics*, vol. 29, No. 6, Jun. 1990; pp. L875-L877.
Sturm M. J. et al. "Joining of YBa$_2$Cu$_3$O$_{7-x}$ Superconductors," *Materials Letters*, vol. 12, No. 5, Dec. 1991; pp. 316-320.
Salama K. et al., "Joining of high current bulk Y-Ba-Cu-O superconductors" *Appl. Phys. Lett.*, vol. 60, No. 7, 17 Feb. 1992; pp. 898-900.
*Patent Abstracts of Japan*, vol. 13 No. 213 (E-759) and JP-A-10 27 172 (Toshiba); Abstract.
I. W. Chen, W. Wu, S. J. Keating, C. Y. Keating, P. A. Johnson, and T. Y. Tien; "Texture Development in YBa$_2$Cu$_3$O$_x$ by Hot Extrusion and Hot-Pressing;" *J. Am. Ceram. Soc.* vol. 70, C388 (1987).
K. Higashida, N. Narita; "High Temperature Deformation and Textures in Oxide Superconductors;" *Adv. in Supercond. III*, cd. K. Kajimura, H. Hayawada, Springer Verlang, 1991.
G. S. Grader, H. M. O'Bryan, W. W. Rhodes, "Improved Press Forging of Ba$_2$YCu$_3$O$_x$ Superconductor;" *Appl. Phys. Lett.* vol. 52, 1983 (1988).
D. Dimos, P. Chaudari, J. Mannhart, F. K. LeGoues, "Orientation Dependence of Grain-Boundary Critical Currents in YBa$_2$Cu$_3$O$_{7-\delta}$ Bicrystals," *Phys. Rev. Lett.* 61, 219 (1988).
W. A. Nash; *Strength of Materials*, Schaum's Series, p. 266.

*Primary Examiner*—Christopher A. Fiorilla
*Attorney, Agent, or Firm*—Pravel, Hewitt, Kimball & Krieger

[57] ABSTRACT

A method of fabricating articles from segments of anisotropically conducting 123 superconductor such that the current transport properties of the article are comparable to those of the individual segments. The segments to be joined are examined to determine the orientation of the ab plane. Contact surfaces are formed where necessary and the segments are brought into contact and the ab planes are brought into parallel alignment. The contacted segments are elevated in temperature and static pressure is applied to accelerate reaction across the interface of the contact surfaces. The so-formed coherent article is then cooled at a controlled rate.

36 Claims, 7 Drawing Sheets

METHOD FOR JOINING SUPERCONDUCTOR SEGMENTS TO FORM A SUPERCONDUCTING ARTICLE

This is a continuation of application Ser. No. 07/837,001 filed on Feb. 14, 1991 now abandoned.

FIELD OF THE INVENTION

The present invention relates to a method of joining segments of 123 superconductor material into an article of much larger dimension with superconducting current transport properties comparable to those of the individual segments.

BACKGROUND OF THE INVENTION

In late 1986 Bednorz and Muller disclosed that certain mixed phase compositions of La—Ba—Cu—O appeared to exhibit superconductivity beginning at an onset temperature of about 30° K., over 7 degrees above the critical temperature of known $Nb_3Ge$ compositions. Bednorz et al., Z. Phys. B., Condensed Matter, Vol. 64, pp. 189-198 (1986). The superconducting composition was determined to have a crystalline structure like that of $K_2Ni_1F_4$, and is therefore referred to as a 214 composition. It has since been determined that whatever the rare earth metal or the alkaline earth metal constituent of such a 214 system may be, the upper temperature limit of superconducting onset, $T_{co}$, of superconductors of a 214 type crystalline structure is no greater than about 38° K. Liquid helium is still required as the coolant for such a 214 type of material.

Following the discovery of superconductivity in a rare earth-alkaline earth-Cu oxide system of a 214 crystalline structure, a new class of rare earth-alkaline earth-copper oxides was discovered which are superconductive at temperatures above the boiling point of liquid nitrogen, 77° K. These new rare earth-alkaline earth-copper oxides are now commonly referred to as "123" high-temperature superconductors (HTS) in reference to the stoichiometry in which the rare earth, alkaline earth, and copper metal atoms are present, namely a ratio of 1:2:3.

The unit cell formula of the 123 HTS compounds is $L_1M_2Cu_3O_{6+\delta}$ ($\delta$=0.1 to 1.0, preferably about 1.0) wherein the constituent, L, is yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium and the alkaline earth constituent, M, is barium, strontium or mixtures thereof. Among this class of 123 HTS compounds, that most preferred is $Y_1Ba_2Cu_3O_{6+\delta}$.

The 123 HTS compounds have a perovskite related crystalline structure. The crystalline unit cell of such 123 compounds consists of three sub-cells in alignment along the crystallographic C-axis wherein the center of the middle subcell is occupied by a rare earth metal atom (L), the center of each end subcell is occupied by an alkaline earth metal atom (M), the corner positions of each subcell are occupied by copper atoms, and intermediate the copper atoms along the edges of the subcells are sites for occupation by oxygen atoms. X-ray and neutron powder diffraction studies indicate the structure of superconductive 123 compounds to be oxygen deficient and that the ordering of oxygen in the basal planes is critical to the existence of superconducting properties in such compounds. See C. Poole et al, *Copper Oxide Superconductors* (John Wiley & Sons 1988).

Studies indicate that when $\delta$ is between about 0.1 to about 0.6, the resulting 123 compound assumes a tetragonal unit cell crystallographic symmetry and is non-superconductive. In the tetragonal unit cell symmetry, the lattice dimension of the c axis is approximately 11.94 angstroms and that of the a and b axes is equal, approximately 3.9 angstroms. When $\delta$ is between 0.7 and 1.0, the resulting 123 compound has an orthorhombic unit cell crystallographic symmetry and is superconductive. The orientation of the oxygen atoms in the orthorhombic unit cell causes the unit cell to compress slightly along the a crystallographic axis and thus the lattice dimension of the a axis is less than that of the b axis. Lattice constants in the orthorhombic symmetry are about a=3.82, b=3.89 and c=11.55 angstroms.

As with the $Nb_3$ Ge and 214 compositions, the new 123 compositions will, when maintained below the critical temperature ($T_c$), exhibit resistance when subjected to an electrical current through a unit area above a certain amperage known as the critical current density ($J_c$).

A 123 HTS compound, whether produced by solid state reaction, coprecipitation or by a sol-gel technique has, as an intrinsic property, a $T_c$ of $\geq 77$ K. However, the $J_c$ of a body of a 123 HTS compound is highly dependant on the methodology used to produce the 123 HTS compound body. Accordingly, the process by which an article of 123 HTS is formed—whether that article is in wire, ribbon, film, rod or plate form—dictates many of the practical uses to which that 123 HTS article may be put, dependent upon the $J_c$ of the article.

For use in superconducting magnets, it is most efficient and desirable to produce a 123 HTS body article in a wire, ribbon, plate or cylindrical form. A wire/ribbon form enables the convenient fabrication of the wire/ribbon coils of the superconducting magnet. Yet, to have commercially practical application for superconducting magnets, the wire/ribbon in which a 123 HTS compound is produced must have in the maximum field of the magnet a $J_c$ at a minimum order of $10^3$ A/cm². For commercially practical applications in power transmission lines, the wire/ribbon needs to have a $J_c$ of at least about $10^3$ to about $10^5$ A/cm² in a magnetic field of about 1 T.

The superconductivity of an ideal orthorhombic 123 lattice network is anisotropic and it has been determined that the critical current density $J_c$ is greatest when measured along an axis in the ab plane of the unit cell. However, articles composed of the orthorhombic compositions which have been produced by solid state reaction are granular and though containing grains with a near perfect lattice structure, the grains of the aggregate material are poorly aligned. Thus, articles composed of such sintered compositions are isotropically superconductive and exhibit current densities below that required for commercial use in superconducting magnets and transmission lines.

Anisotropic superconductivity has been attained on a macroscopic scale in cold pressed and sintered forms of 123 superconductors produced by solid state reaction through the process of melt-texturing wherein the form is heated beyond the peritectic temperature of the superconducting composition to incongruently melt the composition into $L_2M_1Cu_1O_5$ and a liquid phase and cooled at a controlled rate to precipitate out grains of the superconducting material. The temperature profile of the cooling step is critical to the morphology of the precipitated grains, and reference is made to U.S. Pat. No. 4,956,336 for a more thorough explication of this aspect of the melt-texturing process. The effective application of the melt-texturing process causes the precipitation of highly aligned grains, which imparts to the bulk article composed of the precipitated grains anisotropic superconductivity approaching that of the ideal lattice network.

Due to the slow kinetics of melt-texturing methods, fabrication of large anisotropically superconducting articles is time consuming. Typical growth rates of the aligned grain structure are on the order of a few millimeters per hour. In addition, large articles require stringent processing conditions to maintain uniform grain alignment throughout the article. Overcoming these constraints on the size to which an article of 123 superconductor can be produced to have anisotropic superconductivity.

Preparation of larger articles from segments of melt-texturized segments wherein the larger article has comparable $J_c$ properties to those of the segments of which it is composed, would be one means for overcoming the size constraints. Joining segments of bulk superconductor would provide a way by which the attractive properties of melt processed materials can be extended to larger sizes and different shapes. For example, in addition to the possibility of fabricating long conductors capable of carrying high currents, superconducting magnets with uniform field profiles over larger areas could be made for bearing applications.

SUMMARY OF THE INVENTION

The present invention contemplates the fabrication of large superconducting forms, hereafter articles, from small forms, hereafter segments, of 123 superconducting material produced by the melt-texturing process. The invention provides a method of fabricating articles from segments of bulk high temperature 123 superconductor such that the current transport properties of the article are comparable to those of the individual segments. It is used to particular advantage in joining segments of granular superconducting material produced by solid state reaction and sintering or cold pressing, which have been further processed by the melt-texturing process disclosed in U.S. Pat. No. 4,956,336 to align ab planes of the grains throughout the melt-textured segment.

The segments to be joined are examined to determine the orientation of the ab plane of the unit cells. In the preferred embodiment, the article is built up along an axis within the ab plane to produce an article with high $J_c$ along its greatest dimension. When necessary, contact surfaces are shaped to allow alignment of the ab planes of adjacent segments when a segment is rotated in the contact surface plane relative to the adjacent segment. The contact surfaces are then dry polished to a surface roughness of less than 10 $\mu$m. The segments are brought into contact and rotated relative to each other to bring the ab planes of the segments within 5° of parallel. The so contacted and aligned segments are heated at a rate below that which would cause substantial microcracking until a first temperature (hereafter "relaxation temperature") is reached. At some point either prior to the attainment of the relaxation temperature, or thereafter, a static pressure is applied to and maintained on the segments in a direction perpendicular to the contact surface interface in order to promote reaction across the interface. The relaxation temperature is selected to be from between about 95° C. to about 160° C. below the peritectic temperature of the material. Heating may continue after attainment of the relaxation temperature at a rate not exceeding 180° C. hr$^{-1}$ to a second temperature (hereafter "accelerated reaction temperature") below the peritectic temperature. Alternatively, the aligned segments may be held at the relaxation temperature for a period before further heating to the accelerated reaction temperature, but in any event further heating should not proceed at a rate in excess of 180° C. hr$^1$. Preferably, the accelerated reaction temperature is within about 50° C. to about 90° C. below the peritectic temperature, but not in excess of the peritectic temperature, of the 123 superconductor. The aligned segments are maintained under the static pressure at the accelerated reaction temperature for a sufficient period to allow reaction occurring across the contact surface interface to obscure the optical demarcation between the segments at a magnification of 200. After expiration of the accelerated reaction period, the joined segments are allowed to cool at a slow rate, not to exceed 150° C. hr$^{-1}$. Preferably, static pressure is relieved prior to cooling to reduce mechanical stress on the cooling article. A high current superconducting interface has been obtained with segments composed of $Y_1Ba_2Cu_3O_{6+\delta}$ when the segments are elevated at a rate of about 60° C. hr$^{-1}$ to a relaxation temperature of about 910° C. and held at that temperature for 18 hours and then elevated to an accelerated reaction temperature of about 930° C. at a rate of about 12° C. hr$^-$ and held at the accelerated reaction temperature for about 12 hours while under a static pressure of from about 2 to about 6 MPa. The so formed article is then slowly cooled after removal of static pressure in the presence of oxygen until the temperature of the bonded article approaches ambient.

Articles fabricated according to the method of this invention exhibit little or no distinct demarcation at the interface and no evidence of liquid phase separation at the interface. These articles have attained a $J_c$ in the ab plane within about an order of magnitude of the individual segments and exhibit similar behavior under magnetic field.

DETAILED DESCRIPTION OF THE INVENTION

In the method of this invention segments of superconducting material are joined to form a continuous superconducting article by subjecting the segments to high temperature while in contacting relationship for a sufficient period to obscure the optical demarcation between segments to a magnification of 200.

A first concern in the production of large articles by joining melt-textured segments is to preserve the high current density of the individual segments. As previously discussed, the anisotropic character of oxygen deficient 123 superconductors is a consequence of the capacity of the orthorhombic lattice having an axis, a b-axis, a c-axis, an ab plane and an ac plane to superconduct a greater amount of current in a direction parallel to the ab plane than in any direction of which the c crystallographic axis is a vector component. Thus the fabrication of a 123 superconducting body with high $J_c$ requires alignment of the ab planes of each segment with the ab planes of any adjacent segment.

It is also important that the interface between segments not introduce weak links in the superconducting pathway of the ab plane. A "weak link" is any non-superconducting defect which intervenes between the electrical communication from one part of an HTS body to an adjacent part of an HTS body. Welding of the melt-textured segments will produce a weak link at the interface between segments. Another form of weak link that can occur at the interface between segments results from the misalignment of the ab planes of adjacent segments.

The potential interface weak link defects are different in kind from the problem of loss of anisotropic superconductivity. For instance, two segments may be joined together such that the ab planes (hypothetically unbounded) intersect in an axis, rather than being parallel. In studies on single crystals, this form of boundary between crystals has been referred to as "twist-boundary." Segments joined by a twist-boundary interface would have a higher $J_c$ along the axis of intersection. However, where joining is achieved by atomic bonding between atoms of the segments, the twist-boundary may create a weak link at the interface between the segments by preventing organization of the atoms in the interface region into the orthorhombic lattice structure of the individual segments. It is thus desirable to minimize the $J_c$ reducing effects of this type of weak link by aligning the ab planes of adjacent segments in parallel.

Figure 1:
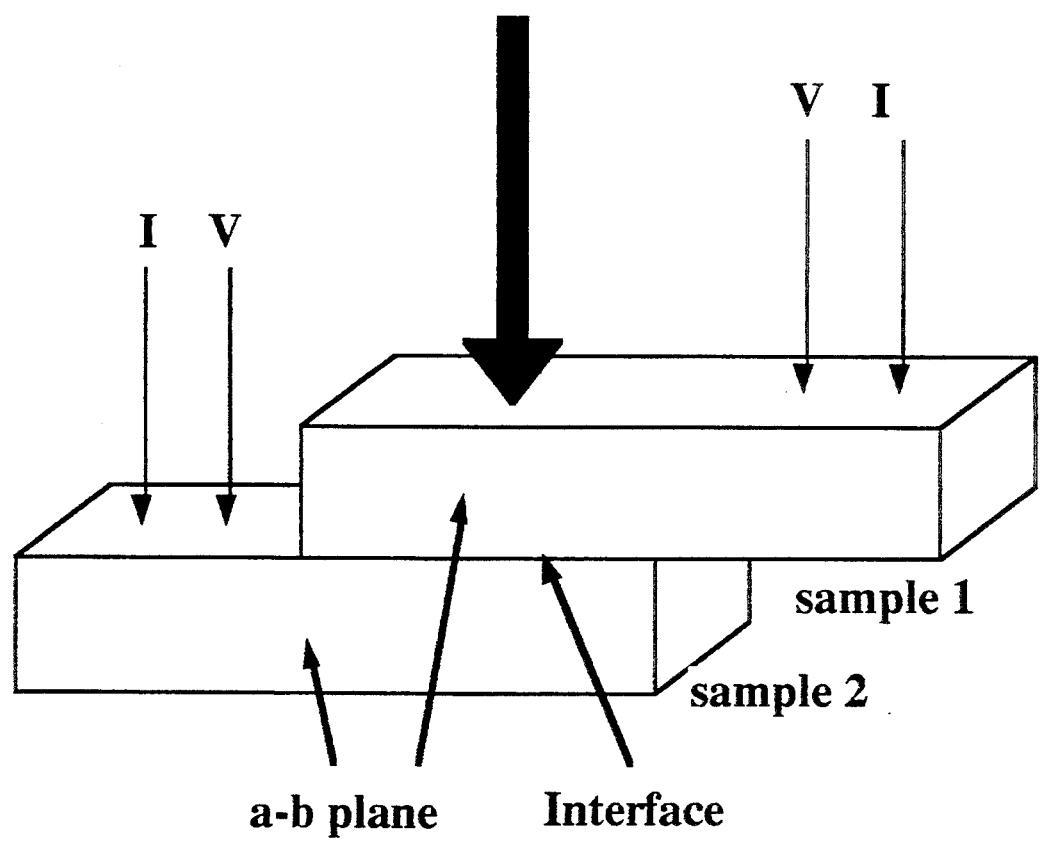
FIG. 1 is a drawing which depicts the alignment of two segments to be joined in forming an article built up along an axis within the ab plane and the direction of applied static pressure.
Figure 2:
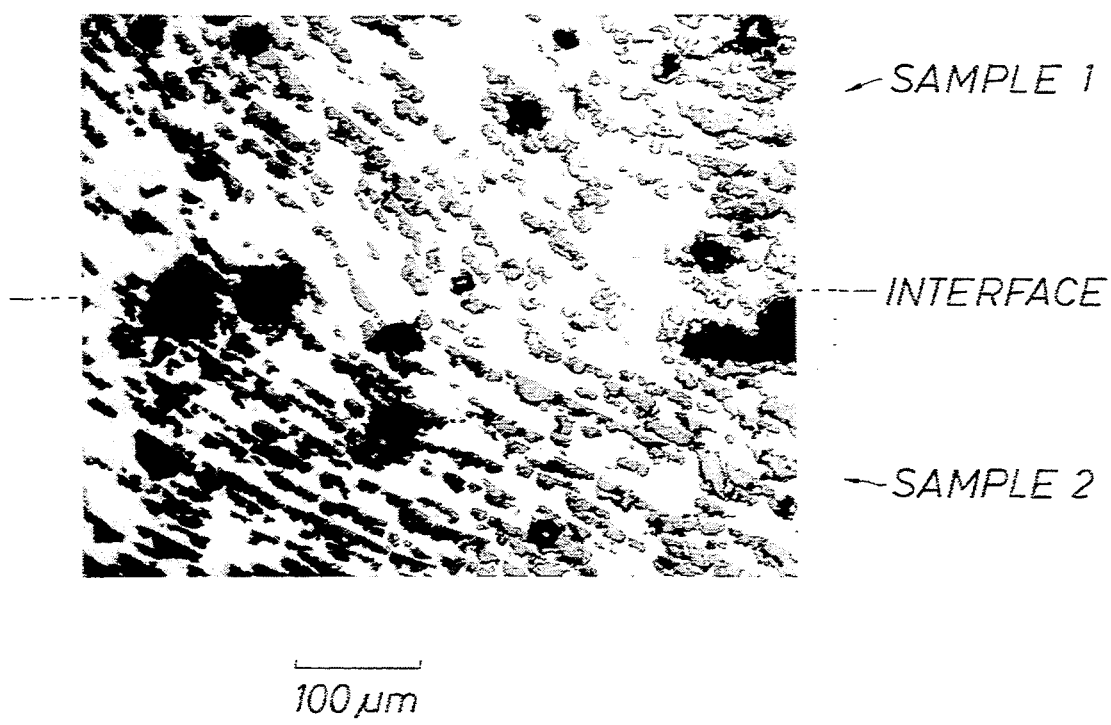
FIG. 2 is an optical micrograph of 200 magnification of the interfacial region of joined segments of $Y_1Ba_2Cu_3O_{6+\delta}$ with the ab planes of the two segments parallel to the plane of the figure.

Referring to FIG. 1, there is depicted tow segments to be joined so as to form an article. Note the designation of the ab planes of the segments and the depiction of the application of pressure. The joint disclosed in FIG. 1 is termed a lap joint.

In the method of the invention, the segments are examined to determine the orientation of the ab plane. The segments are then contacted and aligned so that the ab planes of adjacent segments are within 5° of parallel. The segments are heated to a first—relaxation—temperature, further heated to a second-accelerated reaction-temperature, maintained at the accelerated reaction temperature under static pressure, and cooled to ambient temperature to form a coherent article.

The invention is applicable to those 123 HTS compositions having the formula $L_1M_2Cu_3O_{6+\delta}$ wherein the constituent, L, is a rare earth metal such as yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium and the alkaline earth constituent, M, is an alkali earth metal such as barium, strontium or mixtures thereof, and δ designates the number of oxygen atoms in the unit cell in excess of six and has a value of between about 0.6 to about 1.0. Preferably, L is yttrium, and M is Barium.

The present invention is advantageously applied to produce large articles by joining segments of $L_1M_2Cu_3O_{6+\delta}$ superconductor having highly aligned grains. K. Salama, et. al. *Appl. Phys. Lett.*, Vol. 54, 2352 (1989), U.S. Pat. No. 4,956,336 and U.S. patent application Ser. No. 7/753,01 now U.S. Pat. No. 5,306,697 disclose a process for producing 123 superconductor forms of the aforementioned formula by solid state reaction, followed by cold pressing and optionally sintering of the reaction product. The form is then subjected to a melt-texturing process to orient the grains into a structure having parallel alignment of the ab plane throughout the body. The grains align into plates approximately 10 μm thick, wherein the surfaces of the plates are parallel to the ab plane of the unit cell. By melt-texturing, the anisotropic superconducting properties of the individual grains are realized in the resulting form.

These melt-textured compositions are characterized by attainment of a zero resistance state at a transition temperature, $T_{c1}$, of 77° K. or higher. They exhibit a $J_c$ in zero magnetic field at 77° K., of from about 30,000 to about 85,000 A cm$^{-2}$. Generally, the $J_c$ of these compositions is greater than 70,000 A cm$^{-2}$. At 77° K. and an applied magnetic field of 0.6 T, the composition exhibits a $J_c$ in excess of 37,000 A cm$^{-2}$. Further, at 77° K. and zero magnetic field, the composition exhibits a D.C. current density in excess of 18,500 A cm$^{-2}$. Measurements of surface resistance in the ab plane of the grain-aligned compositions at 98 GHz is approximately 5–6 mΩ at or below 60° K.

By means of the present invention, an article of large dimension may be built up of segments composed of the melt-texture processed compositions of U.S. Pat. No. 4,956,336 and co-pending U.S. patent application Ser. No. 7/753,012 without undue loss of the advantageous superconducting properties of the so produced segments.

While the present invention may be used to build up an article in other directions, it is desirable in many instances to produce an article whose greatest dimension is along the direction of preferential current flow, as, for instance, to produce a rod from which wire or ribbon is to be drawn. Accordingly, the method will be described with reference to expanding an article along an axis contained within the ab plane. For the sake of clarity, further description also makes reference to the joining of segments at surfaces perpendicular to the ab plane, but it is to be understood that in a particular application the article may be built up in a direction outside of the ab plane and that the contact surfaces need not be perpendicular to the ab plane, but may be of complementary angles relative to the ab plane such that rotation of the segments relative to each other in the contact surface plane permits alignment of the ab planes of the segments.

The apparent absence of phase separation at the interface of articles composed of $Y_1Ba_2Cu_3O_{6+\delta}$ fabricated by the present invention suggests that bonding occurs by a process of atomic diffusion. The description of the advantages and constraints of the invention which follows makes reference to a reaction across the interface, which is believed to be atomic diffusion though there is no intention to limit the invention to any particular reaction dynamics.

To produce a joined article having high $J_c$ in the ab plane, the orientation of the ab plane in each segment is first determined. This may be done by microscopic means such as X-ray crystallography or electron microscopy. However, for its simplicity, the most preferred means of determining the orientation of the ab plane in a melt-textured segment is to cleave the segment. Melt-textured 123 superconducting compositions characteristically cleave along the grain boundaries between plates, and hence cleavage is parallel to the ab plane. Thus the orientation of the ab plane for purposes of alignment may be taken as that of the cleaved surface.

After determining the orientation of the ab plane, it may be necessary to form contact surfaces by shaping the segment. Preferably, the contact surfaces are perpendicular to the ab plane. If one of the existing surfaces should happen to be within 5° of perpendicular to the ab plane, shaping may be unnecessary. Shaping of any one segment may be unnecessary if an adjacent segment is shaped so that the ab planes may be rotated into alignment when the shaped surface is in contact with an existing surface of the one segment.

The area of the contact surface is a significant parameter effecting the resistance across the interface between segments. Ideally, intimate bonding will be achieved over the entire contact surface area. However, many factors may frustrate achievement of ideal bonding. The penetration of atoms of one segment into the lattice network of the other is significant and dependent upon the pressure and thermal conditions to which the segments are subjected. The formation of microcracks, a factor which may be controlled to some extent by the rate of heating and cooling and the application of pressure in later steps, also influences interface resistance. To maximize the $J_c$ across the interface, within the mentioned constraints, the contact surface area should be maximized. This may be achieved with the least removal of material by shaping the segment along the surface, or surfaces, most near the desired angle of the contact surface relative to the ab plane.

Shaping may be performed by cutting or abrasive polishing of the segment. A two axis goniometer is well suited for cutting the contact surfaces, after the optimal contact surface plane, i.e. the plane resulting in removal of least material and which provides sufficient interface area, has been determined. Where three or more segments are to be joined the intermediate segments will, of course, have two contact surfaces.

Another factor affecting $J_c$ across the interface is roughness of the contact surfaces. Surface roughness may cause a separation of the surfacial atoms of the segments sufficient to prevent reaction between the segments in the "low" regions of the surface. Hence, the effective area for current transport across the interface may be less than the contact surface. Current transport properties are improved by a fine polishing of the contact surfaces. The contact surfaces should be polished to a roughness of 10 $\mu$m or less to increase the area available for current transfer across the interface of the contact surfaces of adjacent segments. Preferably, the surfaces are dry polished with alumina powder to a roughness of 3 $\mu$m or less.

After the contact surfaces of all segments have been polished to a surface roughness of 10 $\mu$m, preferably 3 $\mu$m or less, the segments are aligned so that the contact surfaces of adjacent segments are abutting. The segments are rotated in the contact surface plane relative to each other to align the ab planes of each segment, preferably, in parallel. It is not essential that the ab planes be aligned in parallel since high $J_c$ may be obtained across a twist-boundary interface. However, a "tilt-boundary" interface is generally less desirable because of the considerable reduction in $J_c$ in the direction of build-up resulting therefrom. In a tilt-boundary interface, the ab planes intersect at a line perpendicular to the direction in which the article is built up. If the orientation of the ab plane has been determined by cleaving the segment, parallelity of the planes may be determined by visual inspection of the alignment of the cleaved surfaces.

The aligned segments are then placed in a furnace equipped with a means for applying pressure to the aligned segments. A conventional furnace may be equipped with an apparatus for applying such pressure, as further described in the Example. Conventionally, a refractory alumina rod may be used to transmit pressure to the segments. However, to prevent reaction between the alumina rod and superconductor it is desirable to shield the segments from the rod. Regardless of the choice of shielding material, some measure of atomic diffusion between the shield and the superconductor may occur. It is therefore desirable to employ as a shield a material which exhibits low atomic diffusion at the temperatures occurring within the furnace, substances composed of bulky and heavy metal atoms being preferred. A gold film is well suited for this purpose. When it is desirable to secure the bottom segment to an alumina or other ceramic platform within the furnace, a silver epoxy may also be used. The contamination resulting from the approximately 2 $\mu$m penetration of gold or silver may be removed by polishing of the ends of the final article.

The segments are joined together by a high temperature reaction. To accelerate the reaction across the interface, the aligned segments are heated to a temperature approaching but below the peritectic temperature of the 123 composition, hereafter referred to as the accelerated reaction temperature. The peritectic temperature of a $L_1Ba_2Cu_3O_{6+\delta}$ composition is that temperature at which its constituents; namely, a solid $L_2Ba_1Cu_1O_5$ and a liquid phase comprising $3BaCuO_2$ and $2CuO$ separate. By ultimately attaining an accelerated reaction temperature of from about 50° C. to about 90° C., preferably from about 70° C. to about 90° C., below the peritectic temperature of the superconductor, an effective rate of reaction is observed.

The segments are maintained at the accelerated reaction temperature for a period from about 0.5 hrs to about 24 hrs, preferably 6 to 18 hrs, which period is hereafter referred to as the accelerated reaction period.

A static pressure is applied to the segments for some portion of the accelerated reaction period. The optimal static pressure depends in part on the tendency of the 123 superconductor to form microcracks and the effect of the applied pressure upon the peritectic temperature of the 123 superconductor. Generally, it is desirable to apply a static pressure which is from about 50% to about 90%, preferably about 75% to about 90%, of the yield stress of the superconductor at the accelerated reaction temperature The yield stress is the pressure at which a given area undergoes a marked and permanent deformation while at constant temperature. As is well known, the yield stress of a ceramic such as the 123 superconductors varies with temperature. It is therefore desirable when applying the present invention to a 123 superconductor other than $Y_1Ba_2Cu_3O_{6+\delta}$ (to which application of the present invention is described in detail below), to experimentally determine the yield stress of a single segment of the superconductor at the accelerated reaction temperature anticipated for use in the fabrication process. The yield stress may be determined by heating a segment of known dimension to the accelerated reaction temperature and observing the amount of deformation of the segment under continuously varying pressures. The yield stress may be obtained graphically from a plot of percent change in dimension in the direction of applied pressure verses the applied pressure, the yield stress being the point at which the percent change in dimension with respect to applied pressure departs from linearity. Generally, a static pressure of from about 2 to about 20 Mpa is sufficient to promote reaction across the interface without increase in resistivity resulting from microcracks. The tendency to form microcracks under the mechanical stress of the process is, in some instances, reduced when pressure is applied after partial heating of the aligned segments and removed prior to cooling. Microcracking is further minimized by close adherence to the temperature profile of the invention.

In the temperature profile of the invention, the aligned segments are first heated to a relaxation temperature at which heating is slowed, or ceased for a period, to reduce thermal stress on the superconductor. The relaxation temperature e.g. 850° C. is from about 95° C. to about 160° C., preferably from about 100° C. to about 130° C., below the peritectic temperature. The aligned segments may be heated to a relaxation temperature of about 95° C. to about 160° C. below the peritectic temperature of the material at a relatively rapid rate of about 30° C. $hr^{-1}$ to about 300° C. $hr^{-1}$, preferably about 30° C. $hr^{-1}$ to about 150° C. $hr^{-1}$, most preferably about 60° C. $hr^{-1}$. The rate of heating to the relaxation temperature may be constant or it may vary. After attainment of the relaxation temperature, heating may continue at a rate not in excess of 180° C. $hr^{-1}$, or alternatively, the temperature of the aligned segments may be maintained for a period, and in any event further elevation in temperature beyond the relaxation temperature shall not proceed at a rate in excess of 180° C. $hr^{-1}$. The optional period at which the temperature is held constant may vary over a wide range.

As previously mentioned, the static pressure is preferably applied after attainment of the relaxation temperature to prevent further aggravation of the stress to which the segments are subjected through heating. Though reaction will be only minimally enhanced by application of pressure before attainment of the relaxation temperature, pressure may also be applied throughout the temperature profile. It is believed that reaction commences at a significant rate upon attainment of the relaxation temperature. Therefore, static pressure is preferably applied upon attainment of the relaxation temperature.

Upon attainment of the relaxation temperature and, optionally, holding at that temperature for a period, the segments are heated at a rate not exceeding about 180° C. $hr^{-1}$, preferably not exceeding about 60° C. $hr^{-1}$(e.g. 6° C. $hr^{-1}$ to about 180° C. $hr^{-1}$, and most preferably not exceeding about 12° C. $hr^{-1}$, to the highest temperature attained in the process, the accelerated reaction temperature. The accelerated reaction temperature (eg. 925° C. to about 960° C.) should be from about 50° C. to about 90° C. below, and preferably from about 70° C. to about 90° C. below, the peritectic temperature of the superconducting material. If the segments are heated beyond the peritectic temperature, the grains will cease to be aligned. Since separation of $Y_1Ba_2Cu_3O_{6+\delta}$ into a liquid phase and a solid phase causes random precipitation of grains upon cooling, except when subjected to a precise cooling profile wherein the grains are uniformly but randomly aligned, phase separation will destroy the anisotropic superconductivity of a $Y_1Ba_2Cu_3O_{6+\delta}$ article, or at a minimum randomly realign the plane of preferential conductivity. Therefore, the peritectic temperature may be considered the upper limit of the accelerated reaction temperature for practice of the invention.

After the aligned segments have attained the accelerated reaction temperature, the temperature is maintained for a period to allow reaction across the interface to optically obscure the visible boundary between segments in the final article to a magnification of 200. Generally, the accelerated reaction temperature should be maintained for 0.5 hrs or more.

After the expiration of the accelerated reaction period, the forming coherent-article is cooled to ambient temperature. Preferably the article is cooled in the furnace at a rate of not more than 150° C. $hr^{-1}$, preferably from about 30° C. $hr^{-1}$ to about 60° C. $hr^{-1}$, and most preferably about 60° C. $hr^{-1}$. The natural cooling rate of the interior of Thermodyne 6000 furnace roughly coincides with this rate of cooling; thus where a furnace equipped with profile control is unavailable, "furnace cooling" may nevertheless yield an article substantially free of microcracks.

It is further preferred that the static pressure be removed before cooling starts, though optionally the static pressure may be maintained throughout the cooling phase. Maintenance of static pressure during cooling will enhance the reaction across the interface but will also risk more extensive microcracking throughout the article than would likely result where the static pressure is removed upon initiation of cooling.

Though not intending to be limited by theory, the material of the interface region appears to reorder during the cooling period into the orthorhombic unit cell of the original composition. While it is believed that the degree of ab plane misalignment influences the tendency for microcracking in the interface region it is possible to achieve only minor microcracking in the interface region if the ab planes are with 5° of parallel alignment, as demonstrated in the photomicrograph of FIG. 1 showing the interface region of an article whose segments were aligned by visual inspection of the cleavage surfaces, the same method used in the Example. Maximum thermal contraction of a cooling orthorhombic 123 superconductor is along the c axis (c: 2–3% v. a, b: 0.8%). Therefore, where the c axis is parallel to the contact surfaces, the bond should be less prone to failure due to microcracking.

After cooling to ambient temperature the final article may be prepared for machining or drawing by polishing the surface to which pressure is applied by means of the alumina push rod, or other means, and the opposing surface. Polishing removes material contaminated with atoms of the shielding material. When gold film or silver epoxy is used, the removal of approximately $2\mu$ of material will expose uncontaminated material. The intended use of the article, such as would require machining, may obviate the need for polishing of these surfaces.

While an article is preferably built up in a single application of the method of this invention to two or more segments, an article may be built up from three or more segments by successive application of this method wherein the segments used in subsequent applications of the method are composed of joined segments of prior applications. One instance where successive applications may be desirable is in the fabrication of an asymmetrically shaped article whose interfaces are substantially out of parallel. For instance, an "L"shaped article may be constructed of 3 rectangular segments wherein a first terminal segment is joined to the intermediate segment at a first interface. Fabrication of the article would be completed by a second application of the method wherein the second terminal segment is aligned along one of its surfaces parallel to its ab plane with a surface of the intermediate segment perpendicular to the first interface such that the ab planes of both the intermediate and second terminal segment are aligned parallel to the second interface, and pressure is applied perpendicular to the second interface.

Having thus described the invention in its most general form, the temperature profile of the method will be further illustrated as it is preferably applied to the fabrication of a $Y_1Ba_2Cu_3O_{6+\delta}$ article.

After determining the orientation of the ab planes of each segment, shaping and polishing of the contact surfaces, alignment of the segments, and shielding, the aligned segments are placed in a furnace equipped with means for applying pressure.

The aligned segments are then heated at a rate of about 60° C. $hr^{-1}$ to a relaxation temperature of from about 900° C. to about 920° C., preferably about 910° C. Static pressure may be applied during this heating phase, though preferably no static pressure is applied until after the attainment of the relaxation temperature.

After attainment of the relaxation temperature, the rate of heating is lowered to from about 6° C. $hr^{-1}$ to about 20° C. $hr^{-1}$, preferably about 12° C. $hr^{-1}$. Optionally, though less preferred, the segments may be maintained at the relaxation temperature for a period of about 5 to about 25 hrs, preferably from about 10 to about 20 hrs and most preferably for about 18 hrs wherein the optional maintenance of the relaxation temperature is desired.

Static pressure is preferably applied after attainment of the relaxation temperature. The static pressure is preferably from about 2 to about 6 Mpa for an article composed of $Y_1Ba_2Cu_3O_{6+\delta}$, most preferably from about 4 to about 6 Mpa.

Upon attainment of an accelerated reaction temperature of from about 920° C. to about 950° C., preferably from about 925° C. to about 935° C., the forming coherent-article is maintained at the accelerated reaction temperature for a period of from about 0.5 hrs to about 24 hrs, preferably from about 6 hrs to about 18 hrs and most preferably about 12 hrs. The application of static pressure is maintained for not less than 0.5 hrs during the accelerated reaction period and preferably for not less than 6 hrs, and most preferably throughout the accelerated reaction period.

After expiration of the accelerated reaction period, the segments are cooled at a rate not to exceed about 150° C. $hr^{-1}$, preferably from about 30° C. $hr^{-1}$ to about 60° C. $^{-1}$ and most preferably about 60° C. $hr^{-1}$. It is further preferred that the static pressure be removed prior to a reduction in temperature to about 910° C.

Preferably, cooling of the article is accomplished in the presence of oxygen, generally the oxygen content of the air being sufficient, in order to insure that the 123 composition obtains the requisite oxygen content for superconductivity, namely an oxygen content which provides for an orthorhombic crystalline symmetry. Alternatively, after the article has been formed, if not then of the optimum oxygen content, it may be subsequently annealed in the presence of oxygen to impart thereto the optimum oxygen content for superconductivity.

Upon return to approximate ambient temperature, the coherent article is removed, and the pressure application surfaces may be polished to remove the gold or silver-contaminated near-surface material.

Having thus described the invention in its general aspects and its application to a $Y_1Ba_2Cu_3O_{6+\delta}$ superconductor, application of the present invention to the fabrication of a $Y_1Ba_2Cu_3O_{6+\delta}$ article and the current transport properties of the article are further illustrated in the Example which follows.

EXAMPLE

Preparation Of The Segments

In a jar mill were mixed 15 weight percent of $Y_2O_3$, 53 weight percent $BaCO_3$ and 32 weight percent CuO. The mixture was placed in an enclosed platinum container which was then heated at a rate of about 7° C. per minute in air until a temperature of 940° C. was obtained. The mixture was allowed to react at this temperature for about 24 hours. Bar samples of dimensions of 6 mm $\times$ 12 mm $\times$ 35 mm were obtained by cold pressing (at room temperature) the oxide mixture at an applied pressure of 10,000 psi. The bars were then partially sliced into segments of 2 mm $\times$ 2 mm $\times$ 8 mm. The segments were then heated in a preheated oven maintained at 1100° C. for ten minutes.

The segments were then cooled rapidly to 1030° C. and then cooled at a rate of 1° C. $hr^{-1}$ to 980° C. The segments were held at 980° C. for eight hours and then cooled to 600° C. at the rate of approximately 60° C. $hr^{-1}$. The segments were then additionally cooled slowly to 400° C. at a rate of approximately 30° C. $hr^{-1}$. The segments were then annealed in oxygen for 24 hours each at 500° C. and 400° C.

Superconducting Properties Of The Individual Segments

The properties of the individual segments were studied by current transport measurements. Current and voltage leads were attached to opposite ends of a segment in the ab plane to characterize the current transfer. A voltage criterion of 1 $\mu$V cm$^{-1}$ was used. The ambient temperature resistance in the ab plane was 21.5 m$\Omega$.

Figure 3:
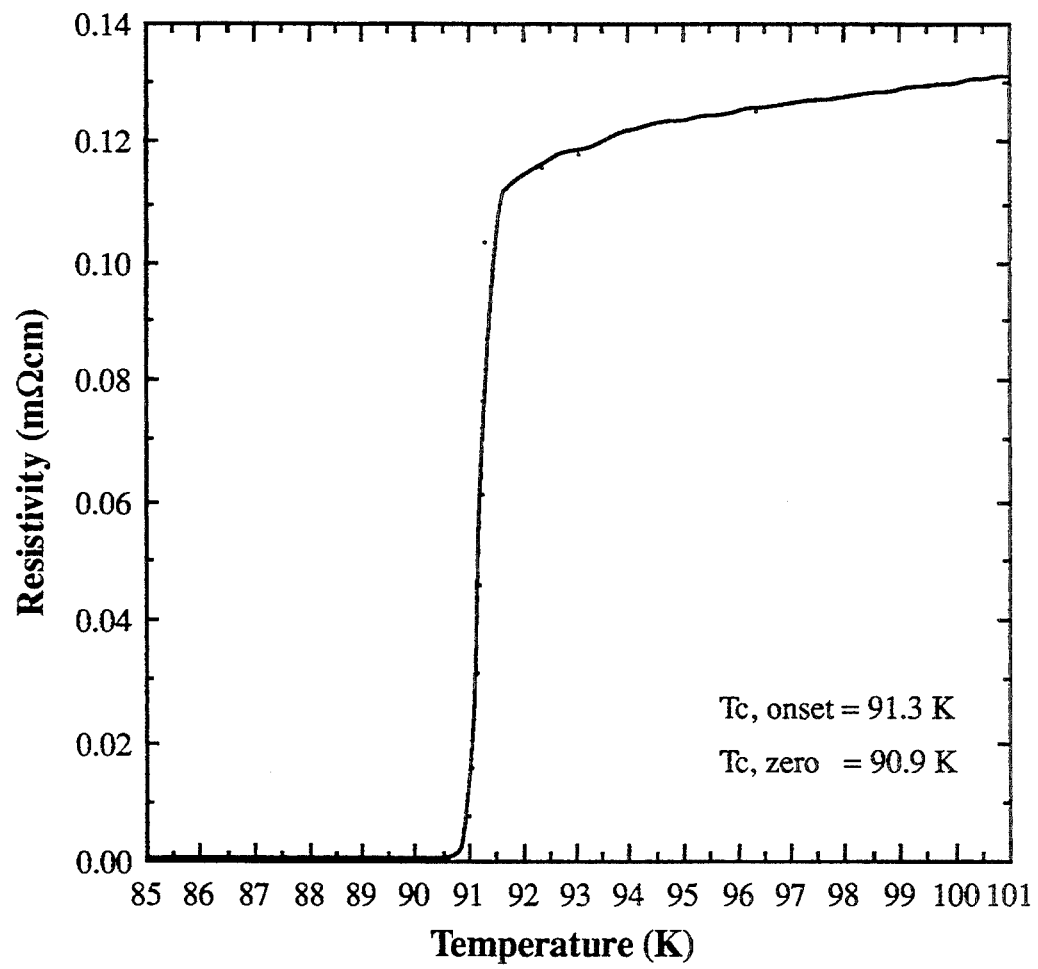
FIG. 3 is a plot of resistance (m$\Omega$) as a function of temperature (°K.) along an 8 mm axis in the ab plane of an individual 2 mm$\times$2 mm$\times$8 mm segment of $Y_1Ba_2Cu_3O_{6+\delta}$ encompassing the range of onset and attainment of superconductivity.

Resistance was monitored as the temperature of the segment was reduced from 101° K. to 90° K. The segment exhibited onset of superconductivity at 91.3° K. and became completely superconducting at 90.9° K. as can be seen in FIG. 3.

Figure 4:
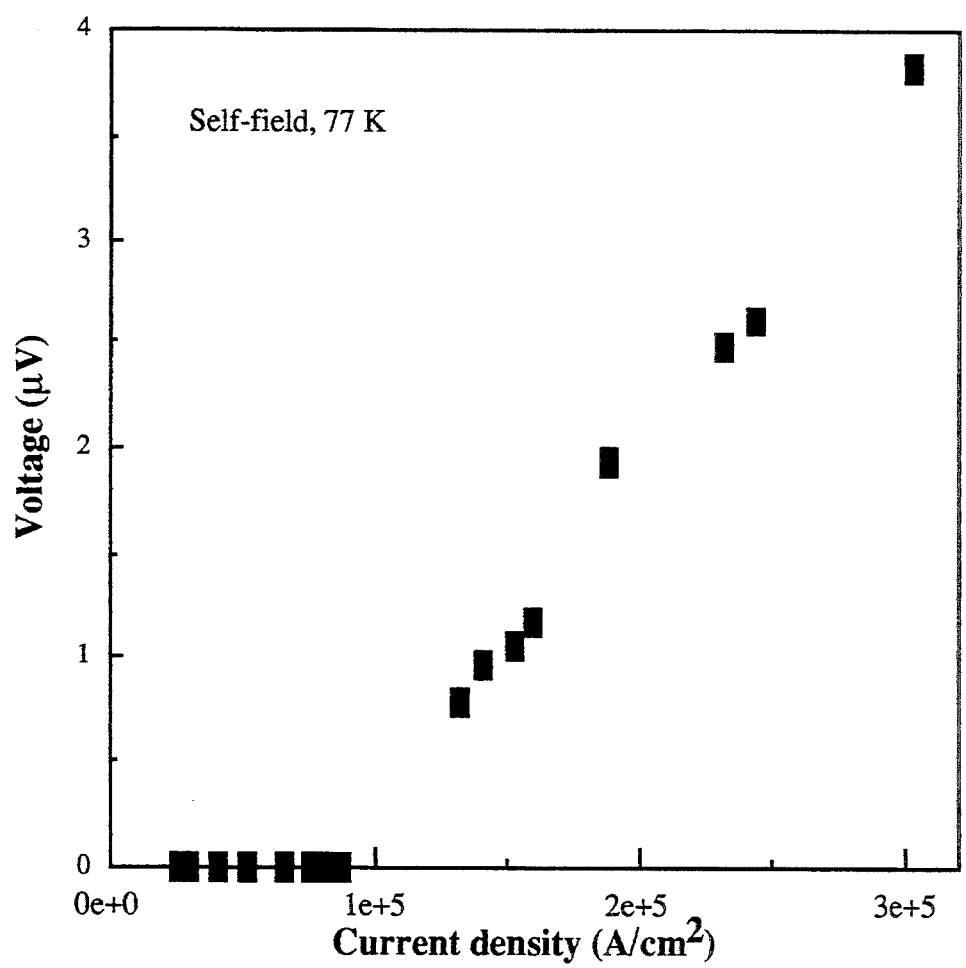
FIG. 4 is a plot of voltage ($\mu$V) as a function of current density (A cm$^{-2}$) at 77° K. in zero magnetic field along an 8 mm axis in the ab plane of an individual 2 mm$\times$2 mm$\times$8 mm segment of $Y_1Ba_2Cu_3O_{6+\delta}$.

Current density measurements were performed using a dc power supply of 120 A rating (H.P. model 6011 A) and a Keithley 181 nanovoltmeter. Zero field measurements were carried out at 77° K. with 2 ms wide current pulses. The voltage developed across the segment was determined to within an accuracy of 0.5 $\mu$V. A $J_c$ of 75,000 A cm$^{-2}$ was observed in zero magnetic field. See FIG. 4.

Figure 5:
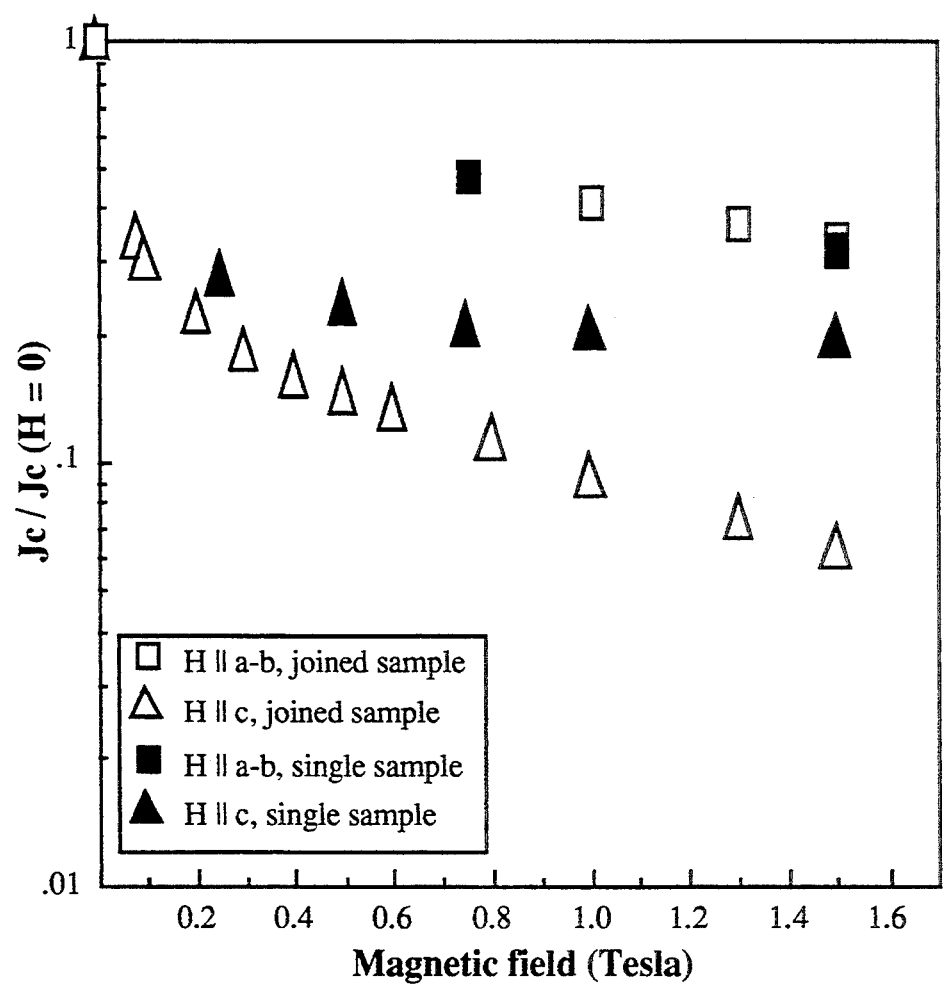
FIG. 5 is a plot of magnetic field dependence of $(J_{cT}/J_{co})$ at 77° K. as a function of magnetic field (Tesla) applied parallel to and perpendicular to the ab plane of both an individual 2 mm$\times$2 mm$\times$8 mm segment and a 2 mm$\times$4 mm$\times$14 mm article composed of two segments joined at a 2–5 mm² physical interface and built up along an axis in the ab plane. Current density was measure along an 8 mm axis and a 14 mm axis the ab plane of the segment and article, respectively.

Continuous DC currents up to 100 A were applied to the segment in a 9" Walker Scientific model HF-9H-CU magnet in measurements of the magnetic field dependence of the critical current density over the range of 0.1 to 1.5 T. A voltage criterion of 1 $\mu$V cm$^{-1}$ was used. Measurements of the current density were taken with the magnetic field aligned parallel to the ab plane and parallel to the c axis. The ratio of critical current density under magnetic influence ($J_{cT}$) over the critical current density in zero magnetic field ($J_{cO}$) is plotted against the magnetic field strength in FIG. 5.

Method Of Joining Segments

The ab planes of two 2 mm$\times$2 mm$\times$8 mm segments were determined by cleaving each segment adjacent to an edge with a razor blade. A two axis goniometer was used to plane a contact surface perpendicular to the cleaved surface along the surface most nearly parallel to the ab plane. The planed surface of each segment was dry polished to a roughness of less than 3 $\mu$m with aluminum powder.

One segment was bonded to an alumina block using silver epoxy at the surface opposite the polished surface and allowed to set.

The bonded segment was placed in a Thermodyne 6000 furnace equipped with an alumina push rod. The Thermodyne 6000 was adapted to receive the push rod by creating a hole through the ceramic material and metal housing in roughly the center of the top of the furnace. A Mullite guide with interior aluminum fitting was tightly fitted into the hole to form a thermal barrier. An alumina pushrod equipped with a plate for supporting dead weights was used for the pushrod. After alignment of the bonded segment with the pushrod, the pushrod was removed and a gold foil was applied to the end of the rod. The second segment was placed atop the first segment with the polished surfaces in contact to form a 4 mm$^2$ contact interface between the two segments. The cleaved planes were aligned within 5° of parallel, alignment being determined by visual inspection. Alignment of the segments with the pushrod was checked, and the alumina rod was held above the segments by means of a clamp as the segments were heated at a rate of 60° C. hr$^{-1}$ to a relaxation temperature of 910° C. Upon attainment of the relaxation temperature, the alumina rod was lowered onto the top segment and sufficient deadweight was placed atop the alumina rod to apply a pressure of 6 MPa to the aligned segments. The relaxation temperature was maintained for 18 hours, after which the temperature was elevated at a rate of 12° C. hr$^{-1}$ to an accelerated reaction temperature of 930° C. The temperature was maintained at 930° C. for 12 hrs, after which the formed coherent-article was allowed to furnace cool at an approximate rate of 60° C. hr$^{-1}$. Upon attainment of approximate ambient temperature the article was removed and separated from the alumina push rod using a diamond saw. Pressure application surfaces were polished with aluminum powder to remove approximately 3 $\mu$m of material.

Superconducting Properties Of The Article

Current and voltage leads were attached on opposite sides across the interface in the ab plane to characterize the current transfer across the interface. A voltage criterion of 1 $\mu$V cm$^{-1}$ was used. The ambient temperature resistance in the ab plane was 23 m$\Omega$ as compared to 21.5 m$\Omega$ for the individual segments.

Figure 6:
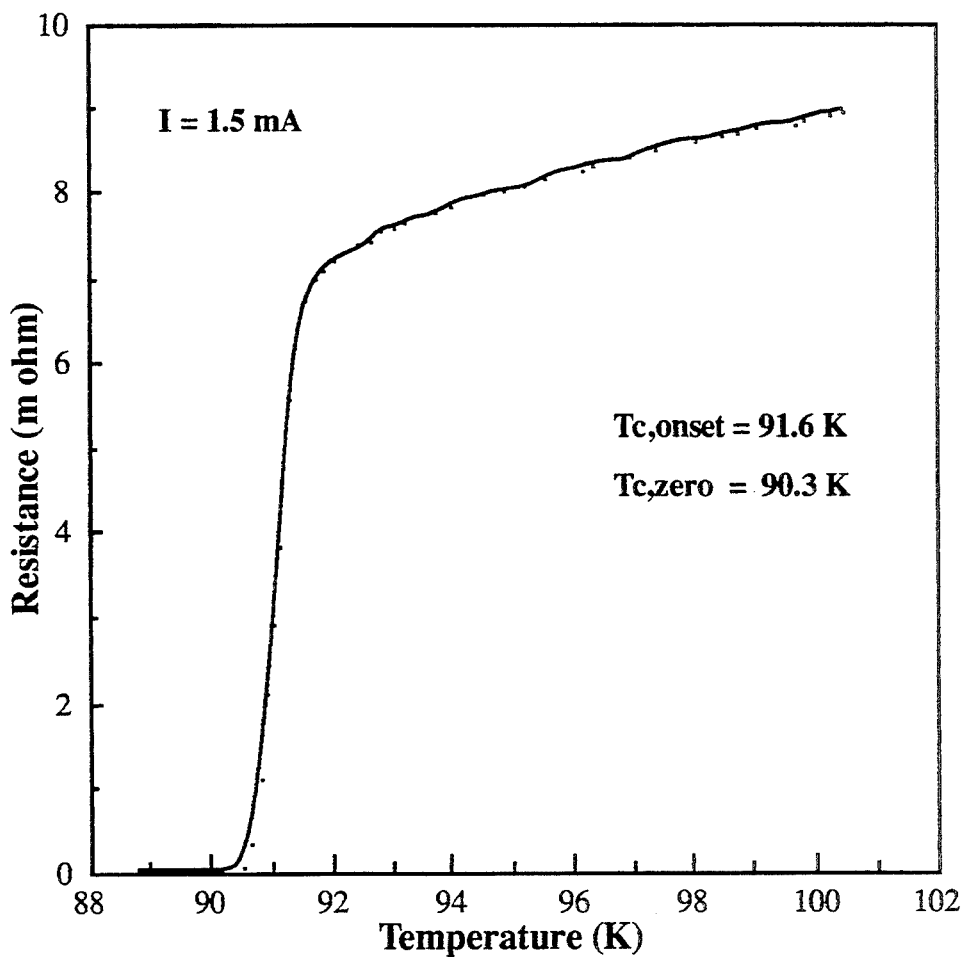
FIG. 6 is a plot of resistance (mΩ) as a function of temperature (°K.) encompassing the range of onset and attainment of superconductivity along a 14 mm axis in the ab plane of an article composed two 2 mm×2 mm×8 mm segments of $Y_1Ba_2Cu_3O_{6+\delta}$ joined by a 2–5 mm² physical interface and built up along an axis in the ab plane.

A 1.5 mA direct current was passed through the article, as the temperature was gradually reduced from 101° K. to 90° K. With reference to FIG. 6, superconductivity onset at 91.6° K. and complete superconductivity was achieved at 90.3° K., as compared to 91.3° K. and 90.9° K. respectively, for the individual segments.

Figure 7:
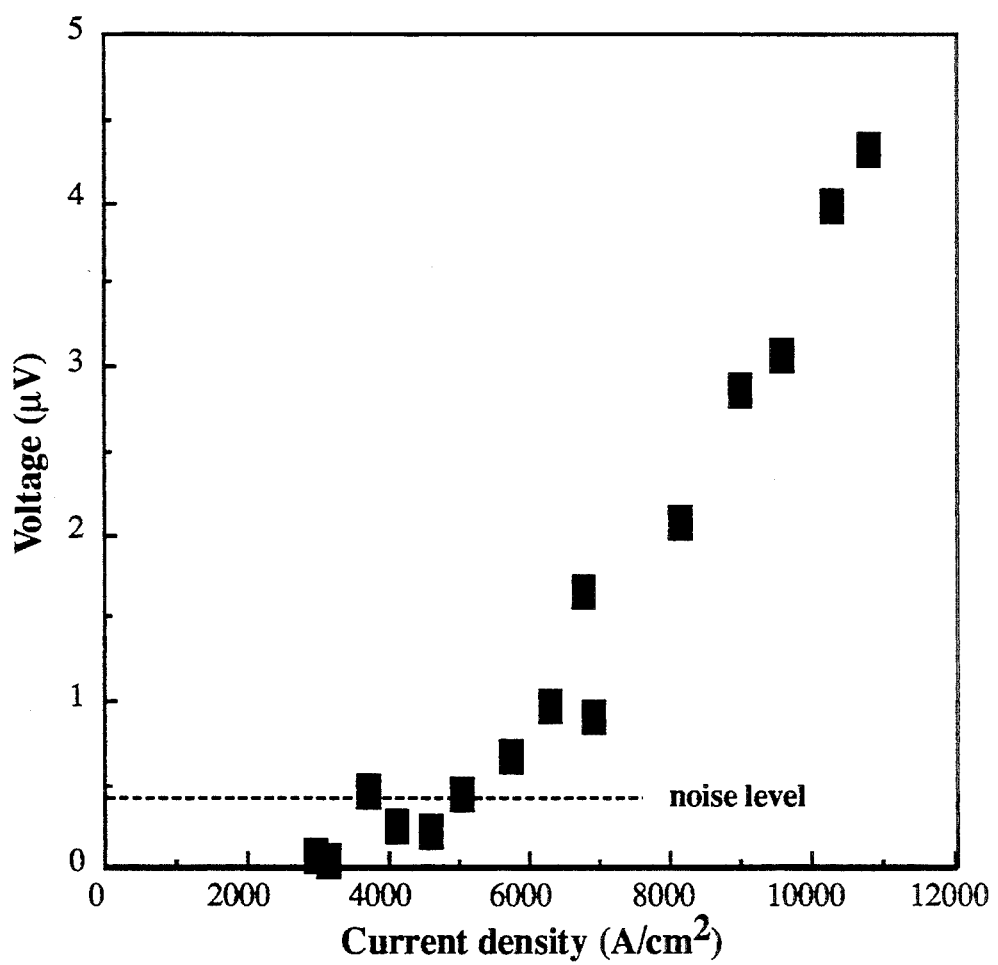
FIG. 7 is a plot of voltage (μV) as a function of current density (A cm$^{-2}$) at 77° K. in zero magnetic field along a 14 mm axis in the ab plane of an article composed two 2 mm×2 mm×8 mm segments of $Y_1Ba_2Cu_3O_{6+\delta}$ joined by a 2–5 mm² physical interface and built up along an axis in the ab plane.

Zero magnetic field current density measurements were carried out at 77° K. using 2 msec current pulses across the leads. The voltage developed across the article was determined to within an accuracy of 0.5 $\mu$V. A critical current density of 6300 A cm$^{-2}$ about an order of magnitude below $J_c$ of the individual segment, was observed. See FIG. 7. The area of the entire interface was used as the cross-sectional area to calculate $J_c$ with the assumption that good superconducting coupling existed throughout the interface. The actual area available for current transfer can be less than this area if possible unbonded regions are considered. Another possibility for the lower $J_c$ could be the misalignment of the ab planes within the 5° range. A third possibility could be structural disorder in the interface region.

Continuous DC currents up to 100 A were applied to the article in a 9" Walker Scientific model HF-9H-CU magnet in measurements of the magnetic field dependence of the critical current density over the range of 0.1 to 1.5 T. A voltage criterion of 1 $\mu$V cm$^{-1}$ was used. Measurements of the current density were taken with the magnetic field aligned parallel to the ab plane and parallel to the c axis. The article exhibited a $J_c$ of 4200 A cm$^{-2}$ at 1.5 T. The ratio of critical current density under magnetic influence ($J_{cT}$) over the critical current density in zero magnetic field ($J_{cO}$) is plotted against the magnetic field strength in FIG. 5. As can be seen from the figure, the magnetic field dependence of the article with magnetic field aligned with the ab plane is essentially coextensive with that of the segment. The longer current transport path in the article may be accountable for the greater magnetic field dependence in the bc plane of the article verses the segment.

As is readily apparent from the above description, additional advantages and modifications will readily occur to one skilled in the art. The invention in its broader aspects is therefore not limited to the specific example shown and described. Accordingly departures may be made from the details shown without departing from the spirit of the invention disclosed, and claimed in the claims, which follow.

What is claimed is:

1. A method for joining a segment of a melt textured anisotropically superconducting 123 superconductor to an adjacent melt textured anisotropically superconducting segment of said 123 superconductor to form a coherent article, said superconductor having:
  (i) a formula $L_1M_2Cu_3O_{6+\delta}$, wherein L is a rare earth metal, M is an alkali earth metal and $\delta$ is a number from about 0.7 to about 1.0;
  (ii) unit cells with an a-axis, a b-axis, a c-axis, an ab plane, and an ac plane;
  (iii) a peritectic temperature; and
  (iv) a yield stress;
said segment and said adjacent segment having ab planes defined by the ab planes of aligned superconductor unit cells therein, to form a larger dimensioned anisotropically superconducting article, comprising the steps of:
  a. contacting the segment with the adjacent segment such that the ab plane of the segment is within 5° of parallel alignment to the ab plane of the adjacent segment;
  b. heating the contacted segments to a relaxation temperature of from about 95° C. to about 160° C. below the peritectic temperature of the superconductor;
  C. further heating the contacted segments to an accelerated reaction temperature of from about 50° C. to about 90° C. below the peritectic temperature, at a rate not in excess of 180° C. $hr^{-1}$;
  d. maintaining the contacted segments at the accelerated reaction temperature and under a static pressure of from about 50% to about 90% of the yield stress of the superconductor measured at the accelerated reaction temperature for a sufficient period for reaction to join the segments into a coherent article; and
  e. cooling the coherent article to ambient temperature at a rate not exceeding 150° C. $hr^{-1}$.

2. The method of claim 1 wherein the segments are of the formula $L_1Ba_2Cu_3O_{6+\delta}$.

3. The method of claim 1 wherein L is yttrium.

4. The method of claim 1 wherein further heating the contacted segments from the relaxation temperature to the accelerated reaction temperature proceeds at a rate of from about 6° C. $hr^{-1}$ to about 18° C. $hr^{-1}$.

5. The method of claim 1 wherein static pressure is applied prior to attainment of the accelerated reaction temperature.

6. The method of claim 5 wherein static pressure is applied prior to attainment of the relaxation temperature.

7. The method of claim 1 wherein the static pressure is from about 2 to about 20 MPa.

8. The method of claim 7 wherein the static pressure is from about 2 to about 6 MPa.

9. The method of claim 1 wherein the accelerated reaction temperature is from about 70° C. to about 90° C. below the peritectic temperature of the superconductor.

10. The method of claim 1 wherein the relaxation temperature is from about 100° C. to about 130° C. below the peritectic temperature of the superconductor.

11. The method of claim 1 wherein the article is allowed to cool from the accelerated reaction temperature to ambient temperature at a rate of from about 30° C. $hr^{-1}$ to about 60° C. $hr^{-1}$.

12. The method of claim 1 wherein the contacted segments are maintained under static pressure at the accelerated reaction temperature for an accelerated reaction period of from about 0.5 to about 24 hrs.

13. The method of claim 12 wherein the accelerated reaction period is from about 6 to about 18 hrs.

14. A method for joining a segment of a melt textured anisotropically superconducting 123 superconductor to an adjacent melt textured anisotropically superconducting segment of said 123 superconductor to form a coherent article, said superconductor having:
  (i) a formula $L_1M_2Cu_3O_{6+\delta}$, wherein L is a rare earth metal, M is an alkali earth metal and $\delta$ is a number from about 0.7 to about 1.0;
  (ii) unit cells with an a-axis, a b-axis, a c-axis, an ab plane, and an ac plane;
  (iii) a peritectic temperature; and
  (iv) a yield stress;
said segment and said adjacent segment having ab planes defined by the ab planes of aligned superconductor unit cells therein, to form a larger dimensioned anisotropically superconducting article, comprising the steps of:
  a. contacting the segment with the adjacent segment such that the ab plane of the segment is within 5° of parallel alignment to the ab plane of the adjacent segment;
  b. heating the contacted segments to a relaxation temperature of from about 850° C. to about 920° C.;
  C. further heating the contacted segments to an accelerated reaction temperature of from about 925° C. to about 960° C. at a rate not in excess of 180° C. $hr^{-1}$;
  d. maintaining the contacted segments at the accelerated reaction temperature and under a static pressure of from about 2 to about 20 MPa for a sufficient period for reaction to join the segments into a coherent article; and
  e. cooling the coherent article to ambient temperature at a rate not exceeding 150° C. $hr^{-1}$.

15. The method of claim 14 wherein the segments are of the formula $L_1Ba_2Cu_3O_{6+\delta}$.

16. The method of claim 14 wherein L is yttrium.

17. The method of claim 14 wherein the contact surfaces are substantially perpendicular to the ab plane.

18. The method of claim 14 wherein static pressure is applied substantially perpendicular to the contact surfaces prior to attainment of the accelerated reaction temperature.

19. The method of claim 18 wherein static pressure is applied substantially perpendicular to the contact surfaces prior to attainment of the relaxation temperature.

20. The method of claim 14 wherein further heating the contacted segments from the relaxation temperature to the accelerated reaction temperature proceeds at a rate of from about 6° C. $hr^{-1}$ to about 18° C. $hr^{31\ 1}$.

21. The method of claim 14 wherein the article is allowed to cool from the accelerated reaction temperature to ambient temperature at a rate from about 30° C. $hr^{-1}$ to about 60° K. $hr^{-1}$.

22. The method of claim 14 wherein the contacted segments are maintained under static pressure at the accelerated reaction temperature for an accelerated reaction period of from about 0.5 to about 24 hrs.

23. The method of claim 22 wherein the accelerated reaction period is from about 6 to about 18 hrs.

24. A method for joining a segment of a melt textured anisotropically superconducting 123 superconductor to an adjacent melt textured anisotropically superconducting segment of said 123 superconductor to form a superconducting article, said superconductor having:

(i) a formula $L_1M_2Cu_3O_{6+\delta}$, wherein L is a rare earth metal, M is an alkali earth metal and $\delta$ is a number from about 0.7 to about 1.0;
(ii) unit cells with an a-axis, a b-axis, a c-axis, an ab plane, and an ac plane;
(iii) a peritectic temperature;
(iv) a yield stress; and
(v) a critical superconductive temperature said segment and said adjacent segment having ab planes defined by the ab planes of aligned superconductor unit cells therein, to form a larger dimensioned anisotropically superconducting article, comprising the steps of:

a. contacting the segment with the adjacent segment such that the ab plane of the segment is within 5° of parallel alignment to the ab plane of the adjacent segment and such that said contacting defines a lap joint;

b. heating the contacted segments to a relaxation temperature of from about 95° C. to about 160° C. below the peritectic temperature of the superconductor;

C. further heating the contacted segments to an accelerated reaction temperature of from about 50° C. to about 90° C. below the peritectic temperature, at a rate not in excess of 180° C. hr$^{-1}$;

d. maintaining the contacted segments at the accelerated reaction temperature and under a static pressure comprising a stress substantially perpendicular to said contact surfaces of from about 50% to about 90% of the yield stress of the superconductor measured at the accelerated reaction temperature for a sufficient period for reaction to join the segments into a coherent article; and e. cooling the coherent article to ambient temperature at a rate not exceeding 150° C. hr$^{-1}$.

25. The method of claim 24 wherein the segments are of the formula $L_1Ba_2Cu_3O_{6+\delta}$.

26. The method of claim 24 wherein L is yttrium.

27. The method of claim 24 wherein further heating the contacted segments from the relaxation temperature to the accelerated reaction temperature proceeds at a rate of from about 6° C. Hr$^{-1}$ to about 18° C. hr$^{-1}$.

28. The method of claim 24 wherein static pressure is applied prior to the attainment of the accelerated reaction temperature.

29. The method of claim 28 wherein static pressure is applied prior to the attainment of the relaxation temperature.

30. The method of claim 24 wherein the static pressure is from about 2 to about 20 MPa.

31. The method of claim 30 wherein the static pressure is from about 2 to about 6 MPa.

32. The method of claim 24 wherein the accelerated reaction temperature is from about 70° C. to about 90° C. below the peritectic temperature of the superconductor.

33. The method of claim 24 wherein the relaxation temperature is from about 100° C. to about 130° C. below the peritectic temperature of the superconductor.

34. The method of claim 24 wherein the article is allowed to cool from the accelerated reaction temperature to ambient temperature at a rate of from about 30° C. hr$^{-1}$ to about 60° C. hr$^{-1}$.

35. The method of claim 24 wherein the contacted segments are maintained under static pressure at the accelerated reaction temperature for an accelerated reaction period of from about 0.5 to about 24 hrs.

36. The method of claim 35 wherein the accelerated reaction period is from about 6 to about 18 hrs.

* * * * *